United States Patent
Shimizu et al.

(10) Patent No.: US 7,518,199 B2
(45) Date of Patent: Apr. 14, 2009

(54) INSULATING FILM CONTAINING AN ADDITIVE ELEMENT AND SEMICONDUCTOR DEVICE

(75) Inventors: Tatsuo Shimizu, Tokyo (JP); Takeshi Yamaguchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 419 days.

(21) Appl. No.: 11/318,622

(22) Filed: Dec. 28, 2005

(65) Prior Publication Data

US 2006/0163676 A1    Jul. 27, 2006

(30) Foreign Application Priority Data

Jan. 26, 2005  (JP)  ............... 2005-018482

(51) Int. Cl.
*H01L 27/088* (2006.01)
(52) U.S. Cl. ............... 257/411; 257/E29.015
(58) Field of Classification Search .......... 257/192, 257/411
See application file for complete search history.

(56) References Cited

U.S. PATENT DOCUMENTS 5,766,743 A * 6/1998 Fujikata et al. ............ 428/212

2006/0157733 A1 * 7/2006 Lucovsky et al. .......... 257/192

FOREIGN PATENT DOCUMENTS

| | | |
|---|---|---|
| JP | 10-506228 | 6/1998 |
| JP | 11-274429 | 10/1999 |
| JP | 2000-345328 | 12/2000 |
| JP | 2001-189422 | 7/2001 |
| JP | 2001-223346 | 8/2001 |
| JP | 2002-280461 | 9/2002 |
| JP | 2004-31760 | 1/2004 |
| JP | 2005-159308 | 6/2005 |
| JP | 2005-298467 | 10/2005 |
| WO | WO 2005/122229 A1 | 12/2005 |

OTHER PUBLICATIONS

Nikkei Electronics, What's New, "FeRAM", pp. 30-31 (2003).
Notice of Reasons for Rejection mailed Jun. 17, 2008, from the Japanese Patent Office in counterpart Japanese Application No. 2005-018482.

* cited by examiner

*Primary Examiner*—Thao X Le
*Assistant Examiner*—Elias Ullah
(74) *Attorney, Agent, or Firm*—Finnegan, Henderson, Farabow, Garrett & Dunner, L.L.P.

(57) ABSTRACT

An insulating film includes an oxide or an oxynitride of a constituent element having a positive valence. The oxide or the oxynitride contains an additive element having a larger valence than the constituent element in a range not less than $3 \times 10^{-8}$ at % and less than $1.6 \times 10^{-3}$ at %.

12 Claims, 2 Drawing Sheets

INSULATING FILM CONTAINING AN ADDITIVE ELEMENT AND SEMICONDUCTOR DEVICE

CROSS-REFERENCE TO RELATED APPLICATIONS

This application is based upon and claims the benefit of priority from prior Japanese Patent Application No. 2005-018482, filed Jan. 26, 2005, the entire contents of which are incorporated herein by reference.

BACKGROUND OF THE INVENTION

1. Field of the Invention

The present invention relates to an insulating oxide or oxynitride and a semiconductor device that uses the same.

2. Description of the Related Art

A method has been employed for increasing a capacitance by decreasing a thickness of a gate insulating film in order to secure a sufficient quantity of charges that are induced in a channel of a metal insulator semiconductor field effect transistor (MISFET). As a result, an $SiO_2$ film, which constitutes the gate insulating film, has been thinned more and more, almost down to a value much less than 1 nm.

With such a thin $SiO_2$ film, a gate-leakage current has become so large that power consumption cannot be suppressed due to waste of standby power. For example, with the thickness of the $SiO_2$ film being 0.8 nm, the gate-leakage current reaches 1 $kA/cm^2$, which is a significant problem in terms of power consumption.

To decrease the power consumption, it is effective to increase the thickness of the film. It has been therefore discussed to use a high-dielectric constant (high-k dielectric) material as an insulating film that can secure a sufficient quantity of charges even if it is thicker than the $SiO_2$ film. As such high-k dielectric and stable materials, a lot of metal oxides and metal oxynitrides are known.

As insulating films having these properties, in particular the following promising candidates are enumerated presently: $HfO_2$, $ZrO_2$, silicate films of these (HfSiO, ZeSiO), and aluminate thin films (HfAlO, ZrAlO), nitrides of these (HfON, ZrON, HfSiON, ZrSiON, HfAlON, ZrAlON), etc.

Besides, such a thin film may be a good candidate as to have a layered perovskite structure, which provides a high-dielectric constant substance. The following will give a few examples of the perovskite structure. The example may include materials composed of a substance which has an $ABO_3$ structure whose A-site is selected at least one from a group of plus-divalent substances of Mg, Ca, Sr, and Ba and whose B-site is selected at least one from a group of plus-tetravalent substances of Ti, Zr, Hf, Ce, C, Si, Ge, and Sn and its nitrides. More specifically, they are, for example, $SrTiO_3$, $BaZrO_3$, $CaHfO_3$, $(Ba, Sr)(Ti, Zr)O_3$, etc.

Besides, an example may include materials composed of a substance which has an $ABO_3$ structure whose A-site and B-side are each selected at least one from a group of plus-trivalent substances of Sc, Y, La, B, Al, Ga, In, and Tl, and a lanthanoid group of La, Ce, Pr, Nd, Pm, Sm, Eu, Gd, Tb, Dy, Ho, Er, Tm, Yb, and Lu and its nitrides. More specifically, they are, for example, $YAlO_3$, $LaAlO_3$, $YScO_3$, $LaScO_3$, $PrScO_3$, $NdScO_3$, $SmScO_3$, $EuScO_3$, $GdScO_3$, $TbScO_3$, $DyScO_3$, $HoScO_3$, $ErScO_3$, $TmScO_3$, $YbScO_3$, $LuScO_3$, $(La, Y)(Al, Sc)O_3$, etc. as promising candidates. This group of materials whose A-site and B-site are both made of a plus-trivalent substance has a relatively large band gap (5 to 7 eV) and a large relative dielectric constant (15-40) and so provides a well-balanced film as a gate insulating film.

Further, materials having a pyrochlore structure are also promising. That is, they may include materials composed of a substance which has an $A_2B_2O_7$ structure and whose A-site is selected at least one from a group of plus-divalent substances of Mg, Ca, Sr, and Ba and whose B-site is selected at least one from a group of plus-pentavalent substances of V, Nb, Ta, P, As, Sb, and Bi and its nitrides. More specifically, $Sr_2V_2O_7$, $Sr_2Nb_2O_7$, etc. are promising candidates.

Besides, they may include materials composed of a substance which has an $A_2B_2O_7$ structure and whose A-site is selected at least one from a group of plus-trivalent substances of Sc, Y, La, B, Al, Ga, In, and Tl, and lanthanoids such as La, Ce, Pr, Nd, Pm, Sm, Eu, Gd, Tb, Dy, Ho, Er, Tm, Yb, and Lu and whose B-site is selected from a group of plus-tetravalent substances of Ti, Zr, Hf, Ce, C, Si, Ge and Sn and its nitrides. More specifically, $La_2Zr_2O_7$, $La_2Hf_2O_7$, $Y_2Zr_2O_7$, $Y_2Hf_2O_7$, etc. are promising candidates.

However, high-dielectric constant metal oxides have a problem of easily containing an oxygen defect.

BRIEF SUMMARY OF THE INVENTION

According to a first aspect of the present invention, there is provided an insulating film comprising an oxide or an oxynitride of a constituent element having a positive valence, the oxide or the oxynitride containing an additive element having a larger valence than the constituent element in a range not less than $3 \times 10^{-8}$ at % and less than $1.6 \times 10^{-3}$ at %.

According to a second aspect of the present invention, there is provided an insulating film comprising an oxide or an oxynitride of a constituent element having a positive valence, the oxide or an oxynitride containing an additive element having a larger valence than the constituent element, and a quantity of the additive element satisfying the following conditions: quantity of additive element $\leq 1.1 \times$(quantity of oxygen defects with no additive element)$\times$(2/valence difference), where valence difference=valence of the additive element−valence of the constituent element.

DETAILED DESCRIPTION OF THE INVENTION

Figure 1:
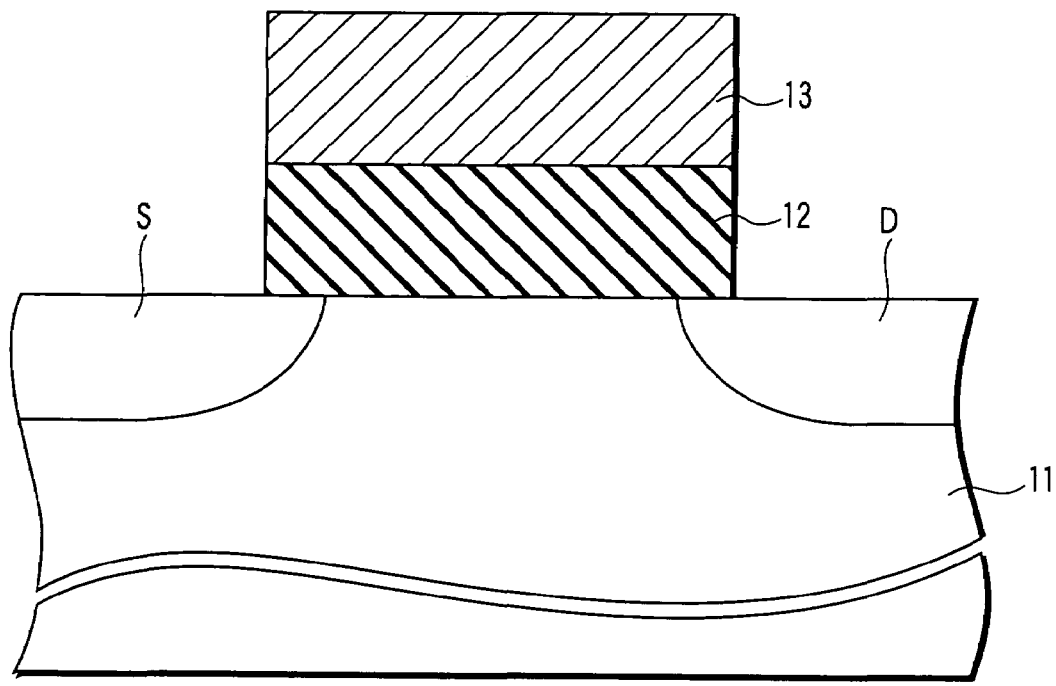
FIG. 1 is a cross-sectional view of main components of an MISFET according to a first example of an embodiment of the present invention.

In the course of a process to develop the present invention, the inventors have studied a method for decreasing the quantity of oxygen defects in the above-described metal oxide that has a high dielectric constant. Consequently, the inventors have obtained the following knowledge.

Present typical film formation methods may include chemical vapor deposition (CVD), atomic layer deposition (ALD), molecular beam epitaxy (MBE), sputtering, etc. At least a film having an oxygen defect quantity of about $5 \times 10^{-3}$ at % can be formed by any one of these methods through film formation conditions. However, there has occurred a need for a metal oxide film having a further smaller oxygen defect density. For oxygen defects in a gate insulating film will create unnecessary charges or shift a threshold value of an MISFET to give a portion (leakage path) prone to flow of a leakage current through the oxygen defects, thereby having a significant influence on a long-term reliability of the MIS-FET.

In its long-term operation, an application of an electric field to a dielectric film is executed and stopped repeatedly. In this case, as charges enter and leave the oxygen defects, dielectric properties and/or electric properties may deteriorate. In some cases, a deteriorated condition may set in to disable normal operation. This problem may be mostly caused by oxygen defects directly or indirectly. It is therefore necessary to decrease the quantity of oxygen defects as much as possible for the purpose of keeping good material properties. Although a present target value of the oxygen defect quantity is a little less than $1 \times 10^{-5}$ at %, a further less value will be needed in future.

First, a target value of oxygen defect quantity will be described. Once an oxygen defect level is created in a metal oxide film, its influence widely spreads depending on a dielectric constant of the film. It actually spreads to 10 nm or larger in a high-dielectric constant film. Furthermore, taking into account that oxygen defects can move, the oxygen defect density must be about $1 \times 10^{16}$ cm$^{-3}$, that is, $1 \times 10^{-5}$ at % or less in terms of atomic percentage. Naturally, the smaller this value is, the higher the performance of the oxide film becomes. In such a manner, the target value of the oxygen defect density is determined.

The following will classify in detail the quantity of oxygen defects. If a film has an oxygen defect quantity of $2 \times 10^{-3}$ at % or more, that is, a density of $2 \times 10^{18}$ cm$^{-3}$ or more, the film cannot be referred to as a completely satisfactory one. One of major problems may be clustering (combination) of oxygen defects. Interaction of the defects cannot be ignored in that a local structural change may occur easily as charges enter and leave these defects. As a result, electric properties and dielectric properties of an insulating film would fluctuate significantly as time elapses, thus resulting in extremely large change over time. A film containing such a quantity of oxygen defects has very bad properties and so needs to decrease the oxygen defects by working out a method of forming the film itself. Such a level of defects can be accommodated by adjusting film formation conditions more or less.

Next, if the oxygen defect quantity is in a region of $2 \times 10^{-4}$ at % or more and less than $2 \times 10^{-3}$ at %, the density is in an order of about $10^{17}$ cm$^{-3}$. In this region, a possibility still exists that charges may be trapped by an oxygen defect to shift a threshold value or form a leakage path. Under a high electric field, defects may be clustered or properties may vary with time as accompanied by a local change in structure. A film having a value in this region can be formed by working out a film formation process. A value of $2 \times 10^{-4}$ at % is critical in that influential ranges of oxygen defects overlap taking into account movability of the defects and so has significant meaning.

If the oxygen defect quantity is in a region of less than $2 \times 10^{-4}$ at %, that is, less than $2 \times 10^{17}$ cm$^{-3}$ in terms of density, defective clusters appear at a lower possibility, thus resulting in a less significant problem of clustering of defects and time-wise variation accompanied by a local change in structure. Still such a problem will occur that the threshold value shifts as charges enter and leave the defects and a leakage path appears. A film having a quantity value in this region cannot be formed through a film formation process itself but can through long-time annealing in an oxygen atmosphere after the film formation process. However, in some cases, an ordinary process such as annealing in the oxygen atmosphere cannot be employed. For example, the formation of a gate insulating film may be accompanied by a side effect such as occurrence of a low-dielectric constant film at an interface with a silicon substrate or an increase in thickness of the low-dielectric constant film. Therefore, there are a lot of cases where annealing in an atmosphere of oxygen cannot be conducted unless a variety of work out is necessary.

Next, such a case is discussed that the oxygen defect quantity is in a region of $1 \times 10^{-5}$ at % or less, that is, $1 \times 10^{16}$ cm$^{-3}$ or less in terms of density. Trapped charges are distributed beyond a hopping-disabled distance, that is, a distance over which wave functions will not overlap, thereby contributing little to leakage. Moreover, a shift in value of a threshold voltage is known to decrease rapidly, which is conceivably because oxygen defects induced to a channel will not increase nor change the structure. A tolerable magnitude of a shift in threshold voltage of a semiconductor device has been reduced gradually over generations. The tolerable value is considered to be 100 mV or less presently and will be lesser in future. The present value of 100 mV can be achieved by suppressing the oxygen defect quantity to the region of $1 \times 10^{-5}$ at % or less. In a few years when a smaller shift in threshold voltage value is required, a region of $1 \times 10^{-6}$ at % or less may be needed.

However, presently there is no technology available to suppress the oxygen defect quantity in a metal oxide down to an extremely small value of $1 \times 10^{-5}$ at % or less.

The following will describe embodiments of the present invention with reference to the drawings. It is to be noted that in the following description, components having substantially the same functions and constitutions are indicated by the same reference symbols and not explained doubly unless necessary.

(Constitution)

In the present embodiment, an oxide or an oxynitride of a constituent element having a positive valence (e.g., metal or semiconductor) is added an element having a higher valence than that of this constituent element. First, intuitive meaning of adding a substance having a higher valence is described. If a positive-valence constituent element of an oxide (hereinafter referred to as constituent element simply) is replaced by a substance having a large valence, extra positive charges occur. Therefore, the extra positive charges draw oxygen from an outside to fill up oxygen defects with them and generate $O^{2-}$ ions, so that a reaction progresses in such a direction that electric neutrality of a system as a whole may be maintained. Accordingly, the oxygen defects decrease depending on the quantity of the added substance.

If the oxide is composed of elements having different valences, the constituent elements mean all of the replaceable ones. For example, in the case of $SrTiO_3$, the constituent elements are Sr, which is plus divalent, and Ti, which is plus tetravalent. A substance which may substitute for Sr is a plus-trivalent or larger-valence substance (e.g., La etc.) and a substance which may substitute for Ti is a plus-pentavalent or larger-valence substance (e.g., Nb, V, etc.). Depending on which one of Sr and Ti is to be replaced, the substance is selected.

Next, the quantity of a substance to be added is described. For example, if it is assumed that Nb, which is plus-pentavalent, is introduced in place of Hf, which is plus-tetravalent, in $HfO_2$, it is found that oxygen defects decrease as the following reaction progresses:

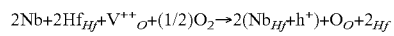

where

Hf$_{Hf}$: Hf present at an Hf site, that is, Hf present at a position where Hf should exist V$^{++}_O$: an oxygen defect (oxygen defect that occurs without Nb added)

Nb$_{Hf}$: Nb substituted for Hf at an Hf site h$^+$: a hole having a positive charge O$_O$: oxygen introduced to a position where an oxygen should be present.

It may be considered that V$^{++}_O$ is suppressed to $8\times10^{-4}$ at % or less by devising the film formation process. An optimal quantity of an additive with respect to this quantity of oxygen defects is determined on the basis of a difference in valence between a substance to be added and a substance to be replaced. That is, the following equation is established:

Optimal quantity of introduced additive=(quantity of oxygen defects with no additive)×(2/valence difference) (1)

It is found that as the valence difference (difference between a valence of a substance to be replaced and that of a substance to be substituted) increases, the necessary quantity of an additive decreases. Further, this equation may be said to give an approximate upper limit of the additive quantity. For an extra additive is no more than a defect as described later and so the additive quantity should be as little as possible. It is to be noted that if the additive quantity exceeds 10%, deterioration develops rapidly as in the later described case of oxygen defects. In this meaning, the following upper limit is present:

Quantity of introduced additive≦1.1×(quantity of oxygen defects in with no additive)×(2/valence difference)

A value of 2 is given because the valence of oxygen defects is 2.

Next, an upper limit and a lower limit of the quantity of an additive are described. Presently, the quantity of oxygen defects in an oxide film can be reduced to $1\times10^{-3}$ at % through $1\times10^{-4}$ at % by devising a film formation process etc. as described above. In future, it is expected that the quantity can be reduced to about $1\times10^{-6}$ at % by a progress of the film formation method. Therefore, a necessary additive quantity is reduced to a minimum in the case where the oxygen defect quantity is about $1\times10^{-6}$ at % and a valence difference is a maximum value of 6 between an additive and an original constituent element.

Simulation by use of the present embodiment has shown that in a region where an oxygen defect quantity is sufficiently small, by reducing the oxygen defect quantity only by 10%, a shift in threshold voltage value decreases by about 50% rapidly after a certain lapse of time. Further, it is decided that by decreasing the oxygen defects by 10% or more, the same effects become conspicuous about the other electric properties and dielectric properties. Such rapid manifestation of the effects may be caused by two factors of decrease in the number of oxygen defects and increase in the distance between adjacent oxygen defects. If the number of oxygen defects can be decreased by 10% or more, sufficient effects can be expected. To eliminate oxygen defects having the quantity of $1\times10^{-6}$ at % by 10% through use of an additive with a valence difference of 6, the quantity of the additive is calculated as follows by using Equation (1):

$1\times10^{-6}\times0.1\times(2/6)\approx3\times10^{-8}$ at %

A value thus calculated is defined as a lower limit of the additive quantity.

An upper limit of an additive quantity is described next. The additive quantity needs to be less than $1.6\times10^{-3}$ at %. This value is determined on the basis of such an upper limit that influential ranges of an additive may overlap in a high-k oxide. This value, which itself is obtained for the present high-k oxide, tends to decrease gradually for such oxides as to have a further higher dielectric constant. For example, if the dielectric constant reaches 100, the upper limit is about $1\times10^{-3}$ at %. In such a manner, the upper limit of an additive quantity is given taking into account the fact that it decreases as the dielectric constant increases.

A procedure to form an oxide film described hitherto may be roughly divided into two processes. The first process is a method for adding an appropriate additive after the oxide film is formed. The second process is a method for adding an additive simultaneously with film formation. The latter method can be performed after knowing an approximate quantity of oxygen defects in the case where there is no additive.

As the upper and lower limits of the additive quantity, $3\times10^{-8}$ at % and $1.6\times10^{-3}$ at % have been given respectively. This lower limit is a largest value required to eliminate oxygen defects by 10% of $1\times10^{-6}$ at % and the upper limit is a smallest value required for influential ranges of an additive not to overlap. Therefore, by narrowing a gap between these upper and lower limits, the quantity of a decrease in quantity of oxygen defects increases. Hence, effects later described increases. In this view, the quantity of an additive is preferably in a region not less than $3\times10^{-8}$ at % and not more than $9.3\times10^{-4}$ at %. More preferably, it is in a region not less than $3\times10^{-7}$ at % and not more than $9.3\times10^{-4}$ at %.

The lower limit value of $3\times10^{-7}$ at % is set for the following reason. That is, as described above, the above-described effects can be obtained very effectively only by decreasing oxygen defects by 10%. If the oxygen defects decrease by 10%, it is known that a shift in threshold voltage value decreases by about 50% after a certain measured lapse of time. However, a decrease in oxygen defects is the most important factor to exert properties of an insulating film. Therefore, it is most preferable to eliminate the oxygen defects completely. It is also known that the shift in threshold voltage value after the same measured lapse of time is reduced to nearly zero if such a quantity of an additive as to eliminate the oxygen defects can be introduced. Moreover, it is also found that almost no shift is given even if the measured lapse of time is prolonged 10-fold or more. Accordingly, to eliminate oxygen defects by 100% of $1\times10^{-6}$ at %, the following equation is established by using Equation (1):

$1\times10^{-6}\times1.0\times(2/6)\approx3\times10^{-7}$ at %

The upper limit value of $9.3\times10^{-4}$ at % is set for the following reason. That is, an upper limit of an additive quantity is determined depending on the conditions that influential ranges of an additive itself may not overlap as described above and, as the first upper limit, a value of $1.6\times10^{-3}$ at % has been given. Further, by dividing this value by $\sqrt{3}$, such conditions are obtained that the influential ranges of the additive itself may not overlap, taking into account uncertainty of a position of the additive owing to thermal fluctuations. Hence, a second upper limit of $9.3\times10^{-4}$ at % is obtained. By satisfying these conditions, it is possible to reduce to 1% or less a possibility of additives coming up against each other when they are exposed to a high temperature in film formation, etc. Therefore, the additives do not come up against each other almost completely, thereby eliminating a change in structure of the insulating film and a change in condition of electrons owing to the additives. This effectively contributes to improvements in dielectric properties of the insulating film.

(Specific Example of Oxide Film of Constituent Elements)

The present embodiment can be applied to general oxides, typical substances of which are summarized below. They include oxides and oxynitrides composed of a variety of constituent elements. The present embodiment can be applied to, for example, the following oxides: $SiO_2$, $Al_2O_3$ $Y_2O_3$, $La_2O_3$, $Gd_2O_3$, $Ce_2O_3$, $CeO_2$, $Ta_2O_5$, $HfO_2$, $ZrO_2$, $TiO_2$, $LaAlO_3$, $SrHfO_3$, $SrZrO_3$, $SrTiO_3$, $HfSiO$, $HfAlO$, $ZrSiO$, $ZrAlO$, $AlSiO$, etc.

Further, the present embodiment can be applied to, for example, the following oxynitrides: $SiON$, $AlON$, $YON$, $LaON$, $GdON$, $CeON$, $TaON$, $HfON$, $ZrON$, $TiON$, $LaAlON$, $SrHfON$, $SrZrON$, $SrTiON$, $HfSiON$, $HfAlON$, $ZrSiON$, $ZrAlON$, $AlSiON$, etc.

Such many insulating films can be employed because according to a method of the present embodiment no new low-dielectric constant layer occurs near an interface and, moreover, an existing low-dielectric constant layer does not increase in film thickness.

(Specific Example of Additive Substance)

The following will describe elements to be added. According to the present embodiment, as described above, an element to be added has a larger valence than an oxidized element of an oxide to be replaced. Since the combinations cannot all be given, only a typical case is enumerated. An idea is to introduce a substance having a larger valence as much as matching the quantity of oxygen defects as described above. However, as described above, the additive quantity has an upper limit, a lower limit, and an optimal value, which are very important rated values.

If an oxide or an oxynitride contains a plus-divalent substance such as Sr, Ba, Ca, or Mg, later-described plus-trivalent substance, plus-tetravalent substance, plus-pentavalent substance, plus-hexavalent substance, plus-septavalent substance, and plus-octavalent substance can be used. Insulating films containing a plus-divalent substance may include, for example, SrO, BaO, CaO, MgO, $SrTiO_3$, $BaHfO_3$, $CaZrO_3$, etc., and their oxynitrides. Since Hf and Si in these substances are considered to be plus-tetravalent, oxygen defects can be decreased by replacing them with a plus-pentavalent or larger-valence substance.

If an oxide or an oxynitride contains a plus-trivalent substance such as Sc, Y, B, Al, Ga, In, and Tl, and lanthanoid including La, Ce, Pr, Nd, Pm, Sm, Eu, Gd, Tb, Dy, Ho, Er, Tm, Yb, Lu, etc., later-described plus-tetravalent substance, plus-pentavalent substance, plus-hexavalent substance, plus-septavalent substance, and plus-octavalent substance can be used. Insulating films containing a plus-trivalent substance may include $Al_2O_3$, $Y_2O_3$, $La_2O_3$, $Gd_2O_3$, $Ce_2O_3$, general substances composed of a lanthanoid element, $LaAlO_3$, $HfAlO$, $SiAlO$, and their oxynitrides. Since Hf and Si in these substances are considered to be of plus tetravalent, oxygen defects can be decreased by replacing them with a plus-pentavalent or larger-valence substance.

If an oxide or an oxynitride contains a plus-tetravalent substance such as Si, Ce, Hf, Ti, Ge, and Sn, later-described plus-pentavalent substance, plus-hexavalent substance, plus-septavalent substance, and plus-octavalent substance can be used. Insulating films containing a plus-tetravalent substance may include $SiO_2$, $CeO_2$, $HfO_2$, $ZrO_2$, $TiO_2$, $SrHfO_3$, $SrZrO_3$, $SrTiO_3$, $HfSiO_4$, $ZrSiO_4$, $TiSiO_2$, and their oxynitrides.

If an oxide or an oxynitride contains a plus-pentavalent substance such as V, Nb, Ta, P, As, Sb, and Bi, later-described plus-hexavalent substance, plus-septavalent substance, and plus-octavalent substance can be used. Insulating films containing a plus-pentavalent substance may include $Ta_2O_5$, $V_2O_5$, $Nb_2O_5$, and their oxynitrides.

If an oxide or an oxynitride contains a plus-hexavalent substance such as Cr, Mo, and W, later-described plus-septavalent substance and plus-octavalent substance can be used. Insulating films containing a plus-hexavalent substance may include $CrO_3$, $MoO_3$, $WO_3$, and their oxynitrides.

If an oxide or an oxynitride contains a plus-septavalent substance such as Mn, Tc, and Re, a later-described plus-octavalent substance can be used. Insulating films containing a plus-septavalent substance may include $Mn_2O_7$, $Tc_2O_7$, $Re_2O_7$, and their oxynitrides.

A plus-trivalent substance to be added may be, for example, Sc, Y, B, Al, Ga, In, or Tl, or a lanthanoid such as La, Ce, Pr, Nd, Pm, Sm, Eu, Gd, Tb, Dy, Ho, Er, Tm, Yb, or Lu.

A plus-tetravalent substance to be added may be, for example, Ti, Zr, Hf, Ce, C, Si, Ge, or Sn.

A plus-pentavalent substance to be added may be, for example, V, Nb, Ta, P, As, Sb, or Bi.

A plus-hexavalent substance to be added may be, for example, Cr, Mo, or W.

A plus-septavalent substance to be added may be, for example, Mn, Tc, or Re.

A plus-octavalent substance to be added may be, for example, Ru or Os.

If an oxide is composed of a plurality of constituent elements, it is necessary to take into account some of the constituent elements to be replaced by an added element so that a substituted element may have a larger valence than the replaced constituent element. For example, in the case of an $SrTiO_3$ film containing Sr, which is plus divalent, and T, which is plus tetravalent, as its constituent elements, Sr is not replaced by Ti, which is plus tetravalent, so that oxygen defects cannot be decreased. For example, in an $SrTiO_3$ film, it is possible to add Y (plus-trivalent) to replace Sr (plus-divalent) and add Nb (plus-pentavalent) to replace Ti (plus-tetravalent). Of course it is possible also to add both of these so that Sr and Ti both may be replaced by Y and Nb respectively.

(Prior Art Literatures)

As described above, according to the present embodiment, the quantity of an additive falls in a region less than $1.6 \times 10^{-3}$ at %. In contrast, p. 30 of No. 2003.9.15 of "Nikkei Electronics", Jpn. Pat. Appln. KOKAI Publication No. 2002-280461 and Jpn. Pat. Appln. KOKAI Publication No. 11-274429 disclose a region of an additive quantity in excess of $2 \times 10^{-3}$ at %. An additive in the region beyond $2 \times 10^{-3}$ at % is excessive, so that excessive addition rather degrade an oxide film and cannot overcome the above-described problem. A reason for that is described below. In a region in excess of $2 \times 10^{-3}$ at %, interaction of additives cannot be ignored. In this case, the additives provide a new defect, which gives rise to a local change in structure as charges enter and leave. As a result, the electric properties and dielectric properties of an insulating film greatly fluctuate over time, so that time-wise variations appear remarkably. As actually described in Jpn. Pat. Appln. KOKAI Publication No. 2002-280461, substances having difference valences are added in quantity, a bias occurs in distribution of charges. Contents disclosed in Jpn. Pat. Appln. KOKAI Publication No. 2002-280461 uses this bias in distribution of charges in a positive manner, thus being incompatible with the present embodiment. In either case, no optimal additive quantity is given.

Jpn. Pat. Appln. KOKAI Publication No. 2004-31760 enumerates all substances. However, as described already, it is necessary to select usable ones of them and limit their quantities. For example, Jpn. Pat. Appln. KOKAI Publication No. 2004-31760 accepts a case where Y is added into $HfO_2$; however, such a combination gives rise to an increase in number of oxygen defects as can be seen from the above description. Moreover, if Y is contained in quantity, Y itself creates a defect level in $HfO_2$, thereby forming a film through which a large current flows. Further, in contrast to the present specification, which has already described that a variety of adverse effects would appear depending on an additive quantity, Jpn. Pat. Appln. KOKAI Publication No. 2004-31760 does not prescribe a special composition region in which oxygen defects decrease to improve film properties. That is, Jpn. Pat. Appln. KOKAI Publication No. 2004-31760 discloses no prescriptions for having effects that can be enabled first by the present embodiment. In particular, an idea of a region in which additives do not interact with each other has been given first by the present embodiment, so that it is noteworthy that the effects of the present embodiment can be exerted only when this idea is limited to the prescribed region.

Jpn. Pat. Appln. KOKAI Publication No. 2001-189422 discloses matching an oxygen defect quantity and a constituent substance defect quantity each other. It specifically discloses that oxygen defects have a remarkable influence on reliabilities because they move easily, and the movement is restricted by creating composite defects with constitution defects. This method involves introduction of defects of a constituent substance and so is unstable essentially in that the quantity of introduced composite defects becomes rather large. Further, in Jpn. Pat. Appln. KOKAI Publication No. 2001-189422, if a perovskite structure is assumed to be $ABO_3$, a relationship of $0.82<A/B<0.97$ is established by introducing A-site defects so that oxygen defects may remain in the same quantity, thus failing to create a substance whose oxygen defects have been decreased. Further, no high-valence substance is added, thus signifying a totally different idea from that of the present embodiment.

Jpn. Pat. Appln. KOKAI Publication No. 2001-223346 discloses adding Ti, which is tetravalent, to oxide $Ta_2O_5$, which is pentavalent. In Jpn. Pat. Appln. KOKAI Publication No. 2001-223346, the quantity of Ti to be added is 0.01 times through equivalent to that of Ta. This means addition of a low-valence substance, which is totally different from the idea of the present embodiment.

FIRST EXAMPLE

The following will describe an MISFET comprising an oxide film related to the present embodiment according to a first example of the present embodiment with reference to FIG. 1. FIG. 1 is a cross-sectional view of main components of the MISFET related to the first example.

As shown in FIG. 1, the MISFET includes a substrate 11, a source region S, a drain region D, a gate insulating film 12, and a gate electrode 13. The substrate 11 is made of, for example, silicon etc. The source region S and the drain region D are formed in a surface of the substrate 11. As described above, the gate insulating film 12 is made of an oxide related to the present embodiment and provided on a channel region formed between the source region S and the drain region D. The gate electrode 13 is formed on the gate insulating film 12.

Next, a method for manufacturing the MISFET shown in FIG. 1 is described. First, a clean surface of the substrate 11 whose main surface had (001) orientation was exposed. In this step, ordinary HF (hydrofluoric acid) treatment was conducted, an extremely thin oxide film $SiO_2$ was formed through ozone oxidation at room temperature, and the surface was protected.

Next, this substrate 11 was conveyed to a sputtering apparatus to sputter an impurity off an outermost surface in an ultrahigh vacuum at 250° C. and then the oxide film $SiO_2$ off the surface at a high temperature of 880° C. In this step, it was confirmed by RHEED that the clean surface appeared, to provide a two-by-one structure.

Next, an amorphous film $HfO_2$ as the gate insulating film 12 was formed by sputtering at a low temperature of 250° C. in a compound mode (condition where particles are sputtered in the forms of $HfO_2$ and HfO). The $HfO_2$ film has a thickness of 4 nm. In this case, a partial pressure of oxygen was set to a rather low value (oxygen partial pressure barely in the compound mode) from an initial stage of film formation by sputtering. Owing also to effects of film formation in the compound mode, the quantity of oxygen defects in the $HfO_2$ film was suppressed to about $4 \times 10^{-4}$ at %. This can be decided on the basis of time-wise variations in shift of the threshold voltage value and leakage current as described later. This value well coincides with a value obtained through mass spectrometry.

In formation of the $HfO_2$ film, a target of $Nb_2O_5$ was introduced to perform simultaneous sputtering. It is to be noted that the quantity of $Nb_2O_5$ must be very small. The quantity of $Nb_2O_5$ was controlled by adjusting a voltage applied to $Nb_2O_5$. In the present example, that quantity is not more than twice the quantity of oxygen defects in the $HfO_2$ film, which was $4 \times 10^{-4}$ at %. In the present example, a best film obtained by adjusting the application voltage had an Nb addition quantity of about $8 \times 10^{-4}$ at %, which was about twice the quantity of oxygen defects in the $HfO_2$ film. Although the sputtering method was employed as the film formation method, almost the same effects were obtained also by the MEB method, the CVD method, the ALD method, etc. Next, TiN was sputtered to form a film as the gate electrode 13. Then, the source region S and the gate region D were formed by ion implantation etc.

We checked an n-type MISFET thus obtained. More specifically, we checked its properties both before and after addition of Nb. First, both before and after the addition, the gate insulating film 12 was very thin, measuring 0.67 nm in film thickness calculated as an $SiO_2$ film (EOT).

Further, a leakage current upon application of a large electric field of 5 MV/cm measured 1.0 A/cm² or less before addition of Nb and a greatly decreased value of 0.01 A/cm² after the addition.

Further, as viewed in terms of time-wise variation in a condition where a voltage was applied, the case where Nb was not introduced encountered breakdown within a several hours and the case where Nb was introduced did not encounter breakdown even in 10 times the lapse of time.

Further, before introduction of Nb, a phenomenon appeared remarkably of the threshold voltage value shifting over time, with a shift of about 100 mV being observed in about one hour, whereas after introduction of Nb it shifted only 10 mV or so even after 10 hours.

These effects were obtained because the oxygen defects decreased by an order of magnitude to suppress deteriorations in electric and dielectric properties.

SECOND EXAMPLE

Figure 2:
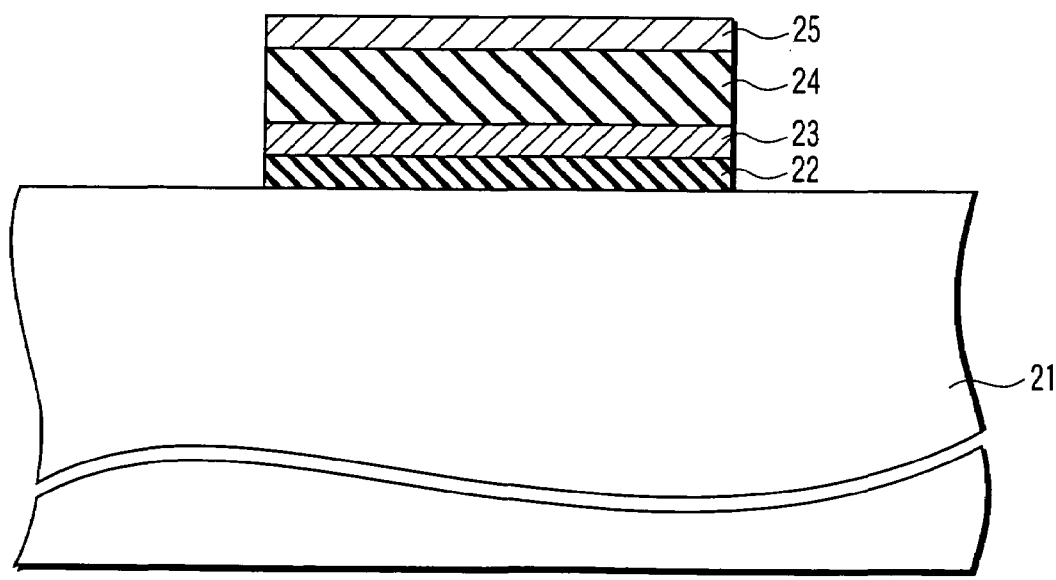
FIG. 2 is a cross-sectional view of main components of a capacitor according to a second example of the embodiment of the present invention.

The following will describe a metal insulator metal (MIM) capacitor made of $Pt/SrTiO_3/Pt$ according to a second example of the present embodiment with reference to FIG. 2.

FIG. 2 is a cross-sectional view of main components of an MIM capacitor related to the second example.

As shown in FIG. 2, the MIM capacitor includes a substrate 21 and a buffer film 22, an electrode 23, a capacitor insulating film 24, and an electrode 25 that are deposited on the substrate 21 sequentially. The substrate 21 is made of, for example, silicon etc. The buffer film 22 is made of, for example, amorphous TiN. The electrodes 23 and 25 are made of Pt, for example. The capacitor insulating film 24 is made of an oxide related to the present embodiment as described in detail later.

Next, a method of manufacturing the MIM capacitor shown in FIG. 2 will be described. First, a clean surface of the substrate 21 whose main surface has (001) orientation was exposed by the same step as that of the first example.

Next, the buffer film 22, the electrode 23, and the capacitor insulating film 24 made of $SrTiO_3$ were formed by sputtering in the compound mode at a low temperature of 250° C. A film thickness of $SrTiO_3$ was set to 10 nm. In this case, a partial pressure of oxygen was set to a rather low value (oxygen partial pressure barely in the compound mode) from an initial stage of film formation by sputtering. Owing also to effects of film formation in the compound mode, the quantity of oxygen defects in the $SrTiO_3$ film was suppressed to about $3 \times 10^{-4}$ at %. This value well coincides with a value obtained through mass spectrometry.

In formation of the $SrTiO_3$ film, a target of $Nb_2O_5$ was introduced to perform simultaneous sputtering. It is to be noted that the quantity of $Nb_2O_5$ must be very small. The quantity of $Nb_2O_5$ was controlled by adjusting a voltage applied to $Nb_2O_5$. In the present example, that quantity is not more than twice the quantity of oxygen defects in the $SrTiO_3$ film, which was $3 \times 10^{-4}$ at %. In the present example, a best film obtained by adjusting the application voltage had an Nb addition quantity of about $6 \times 10^{-4}$ at %, which was about twice the quantity of oxygen defects in the $SrTiO_3$ film. Although the sputtering method was employed as the film formation method, almost the same effects were obtained also by the MEB method, the CVD method, the ALD method, etc. Next, Pt was sputtered to form a film as the gate electrode 25.

We checked an MIM capacitor thus obtained. More specifically, we checked its properties both before and after addition of Nb. First, both before and after the addition, the capacitor insulating film 24 was very thin, measuring 0.5 nm in film thickness calculated as an $SiO_2$ film (EOT).

Further, a leakage current upon application of a large electric field of 5 MV/cm measured 2.0 A/cm² or less before addition of Nb and a greatly decreased value of 0.01 A/cm² after the addition.

Further, as viewed in terms of time-wise variation in a condition where a voltage was applied, the case where Nb was not introduced encountered breakdown within a several hours and the case where Nb was introduced did not encounter breakdown even after 10 times the lapse of time.

Further, before introduction of Nb, a capacitance vs. voltage (CV) plot exhibited a large hysteresis as charges were accumulated over time, whereas the film into which Nb was introduced exhibited a suppressed hysteresis of 20 mV or less.

These effects were obtained because the oxygen defects decreased by an order of magnitude to suppress deteriorations in electric and dielectric properties.

THIRD EXAMPLE

Figure 3:
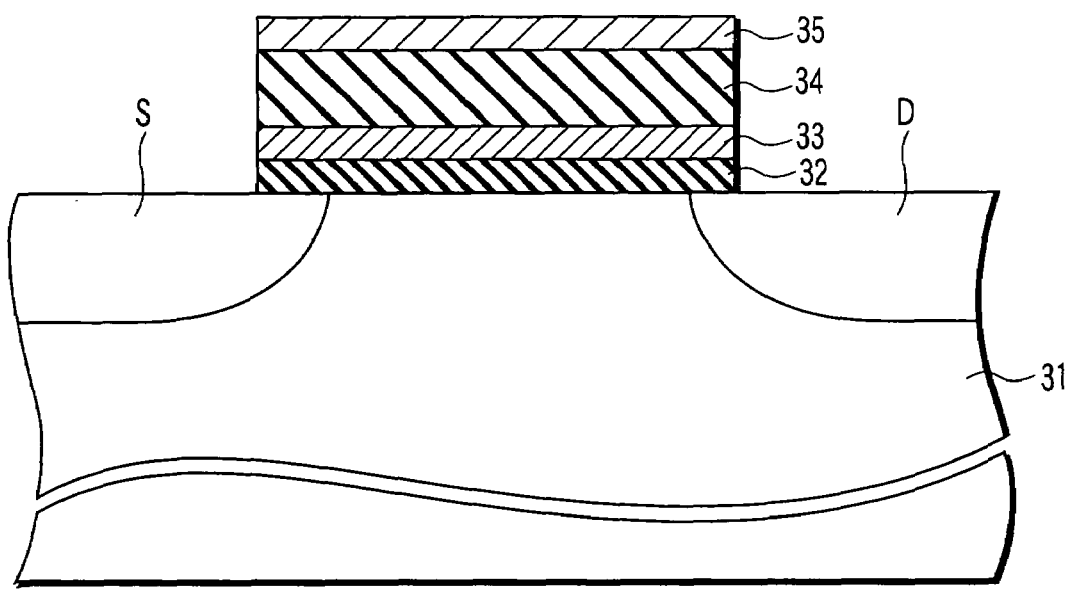
FIG. 3 is a cross-sectional view of main components of a capacitor according to a third example of the embodiment of the present invention.

The following will describe a capacitor structure comprised of polysilicon, $Al_2O_3$, and polysilicon according to the third example of the present embodiment, with reference to FIG. 3. This structure corresponds to an insulating film (so-called inter-polysilicon insulating film) between a floating gate and a control gate of a cell transistor of a flash memory and a peripheral portion of this insulating film. FIG. 3 is a cross-sectional view of main components of a capacitor related to the third example.

As shown in FIG. 3, the capacitor structure includes a substrate 31 and an insulating film 32, an electrode 33, an insulating film 34, and an electrode 35 that are deposited on the substrate 31 sequentially. The substrate 31 is made of silicon etc., for example. The insulating film 32 is made of amorphous SiON, for example. The electrodes 33 and 35 are made of (P-doped) poly-silicon. The insulating film 34 is made of an oxide related to the present embodiment as described in detail later.

Next, a method of manufacturing a capacitor related to the third example is described. First, a clean surface of the substrate 31 whose main surface has (001) orientation was exposed by the same step as that of the first example.

Next, the insulating film 32, the electrode 33, and $Al_2O_3$ films as the insulating film 34 were formed by sputtering in the compound mode at a low temperature of 250° C. A film thickness of $Al_2O_3$ was set to 15 nm. A partial pressure of oxygen was set to a rather low value (oxygen partial pressure barely in the compound mode) from an initial stage of film formation by sputtering. It was confirmed by mass spectrometry that owing also to effects of film formation in the compound mode, the quantity of oxygen defects in the $Al_2O_3$ film was suppressed to about $4 \times 10^{-3}$ at %.

In formation of the $Al_2O_3$ film, a target of $HfO_2$ was introduced to perform simultaneous sputtering. It is to be noted that the quantity of $HfO_2$ must be very small. The quantity of $HfO_2$ was controlled by adjusting a voltage applied to $HfO_2$. In the present example, that quantity is not more than twice the quantity of oxygen defects in the $Al_2O_3$ film, which was $4 \times 10^{-4}$ at %. In the present example, a best film obtained by adjusting the application voltage had an Hf addition quantity of about $8 \times 10^{-4}$ at %, which was about twice the quantity of oxygen defects in the $Al_2O_3$ film. Although the sputtering method was employed as the film formation method, almost the same effects were obtained also by the MEB method, the CVD method, the ALD method, etc. Next, polysilicon was sputtered to form a film as the electrode 35.

Then, by forming, in a surface of the substrate 31, a source region S and a drain region D in such a manner as to sandwich a channel region below the electrode 33 through ion implantation, etc., a cell transistor of a flash memory is formed.

We checked a capacitor thus obtained. More specifically, we checked its properties both before and after addition of Hf. First, both before and after the addition, the insulating film 34 was a thin gate insulating film, measuring 2.5 nm in film thickness calculated as an $SiO_2$ film (EOT).

Further, a leakage current upon application of a large electric field of 5 MV/cm measured 0.1 A/cm² or less before addition of Hf and a greatly decreased value of 0.001 A/cm² after the addition.

Further, as viewed in terms of time-wise variation in a condition where a voltage was applied, the case where Hf was not introduced encountered breakdown within a several hours and the case where Hf was introduced did not encounter breakdown even after 10 times the lapse of time.

Further, before introduction of Hf, a capacitance vs. voltage (CV) plot exhibited a large hysteresis as charges were accumulated over time, whereas the film into which Hf was introduced exhibited a suppressed hysteresis of 10 mV or less.

These effects were obtained because the oxygen defects decreased by an order of magnitude to suppress deteriorations in electric and dielectric properties.

FOURTH EXAMPLE

The following will describe a capacitor structure comprised of polysilicon, $LaAlO_3$, and polysilicon according to the fourth example of the present embodiment. This structure corresponds to a so-called inter-polysilicon insulating film of a flash memory and a peripheral portion of this insulating film.

The capacitor structure is the same as the third example except for different materials of the following components. In the fourth example, the insulating film 34 is made of $LaAlO_3$.

Next, a method of manufacturing a capacitor related to the fourth example is described. First, a clean surface of the substrate 31 whose main surface has (001) orientation was exposed by the same step as that of the first example.

Next, the insulating film 32, the electrode 33, and $LaAlO_3$ films as the insulating film 34 were formed by sputtering in the compound mode at a low temperature of 250° C. A film thickness of $LaAlO_3$ was set to 12 nm. In this case, a partial pressure of oxygen was set to a rather low value (oxygen partial pressure barely in the compound mode) from an initial stage of film formation by sputtering. It was confirmed by mass spectrometry that owing also to effects of film formation in the compound mode, the quantity of oxygen defects in the $LaAlO_3$ film was suppressed to about $3 \times 10^{-4}$ at %.

In formation of the $LaAlO_3$ film, a target of $ZrO_2$ was introduced to perform simultaneous sputtering. It is to be noted that the quantity of $ZrO_2$ must be very small. The quantity of $ZrO_2$ was controlled by adjusting a voltage applied to $ZrO_2$. In the present example, that quantity is not more than twice the quantity of oxygen defects in the $LaAlO_3$ film, which was $3 \times 10^{-4}$ at %. In the present example, a best film obtained by adjusting the application voltage had a Zr addition quantity of about $6 \times 10^{-4}$ at %, which was about twice the quantity of oxygen defects in the $LaAlO_3$ film. Although the sputtering method was employed as the film formation method, almost the same effects were obtained also by the MEB method, the CVD method, the ALD method, etc. Next, polysilicon was sputtered to form a film as the electrode 35.

Then, by forming, in a surface of the substrate 31, a source region S and a drain region D in such a manner as to sandwich a channel region below the electrode 33 through ion implantation, etc., a cell transistor of a flash memory is formed.

We checked a capacitor thus obtained. More specifically, we checked its properties both before and after addition of Zr. Both before and after the addition, the insulating film 34 was a thin gate insulating film, measuring 2 nm in film thickness calculated as an $SiO_2$ film (EOT).

Further, a leakage current upon application of a large electric field of 5 MV/cm measured 0.1 A/cm² or less before addition of Zr and a greatly decreased value of 0.001 A/cm² after the addition.

Further, as viewed in terms of time-wise variation in a condition where a voltage was applied, the case where Zr was not introduced encountered breakdown within a several hours and the case where Zr was introduced did not encounter breakdown even after 10 times the lapse of time.

Further, before introduction of Zr, a capacitance vs. voltage (CV) plot exhibited a large hysteresis as charges were accumulated over time, whereas the film into which Zr was introduced exhibited a suppressed hysteresis of 2 mV or less.

These effects were obtained because the oxygen defects decreased by an order of magnitude to suppress deteriorations in electric and dielectric properties.

(Effects, etc.)

In an insulating film related to the embodiment of the present invention, to an oxide or an oxynitride of a constituent element, an element having a higher valence than the constituent element is added. This decreases the quantity of oxygen defects in the insulating film.

As a further higher dielectric constant is needed in future, a further larger a spread of the oxygen defects becomes. In this case also, the quantity of oxygen defects in an initial film cannot be decreased so much, so that there is a high possibility that the film may have a large leakage current. In this case also, the method of the present embodiment is effective in that it can clear away a very small quantity of oxygen defects.

Further, according to the present embodiment, an element is added to decrease the quantity of oxygen defects in an oxide or an oxynitride. Since the additive is considerably harder to move than an oxygen defect, it is less liable to bring about deteriorations in properties more than the oxygen defect. It is thus possible to decrease the quantity of oxygen defects without bringing about deteriorations in properties of an oxide or an oxynitride.

Further, according to the present embodiment, a mechanism can work which inhibits oxygen defects from being reproduced, thereby suppressing creation of oxygen defects in the subsequent processes.

Further, according to the present embodiment, in the case where it is difficult to decrease the quantity of oxygen defects in an oxide or an oxynitride because of a process, the oxygen defects can be decreased. Moreover, by optimizing the quantity of additive, it is possible to further decrease a very small quantity of oxygen defects of, for example, $1 \times 10^{-4}$ at % or less. In principle, it is possible to further reduce the quantity of oxygen defects by an order of magnitude.

A decrease in quantity of oxygen defects in an oxide or an oxynitride has the following effects recognized. First, interior fixed charges and fixed polarization are eliminated to improve dielectric properties. Second, the number of trap levels decreased to reduce a leakage current. Third, a shift in threshold voltage value of an MISFET is eliminated. Fourth, breakdown due to a trap level is suppressed to improve long-term reliabilities. As a result of these effects, electric and dielectric properties are improved beyond the conventional limits of oxides and oxynitrides. In particular, the problem of time-wise variation is solved drastically.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An insulating film comprising an oxide or an oxynitride of a constituent element having a positive valence, the oxide or the oxynitride containing an additive element having a larger valence than the constituent element in a range not less than $3 \times 10^{-8}$ at % and less than $1.6 \times 10^{-3}$ at %.

2. The insulating film according to claim 1, wherein
the constituent element includes at least one of Sr, Ba, Ca, and Mg; and
the additive element includes at least one of Sc, Y, B, Al, Ga, In, Tl, La, Ce, Pr, Nd, Pm, Sm, Eu, Gd, Tb, Dy, Ho, Er, Tm, Yb, Lu, Ti, Zr, Hf, C, Si, Ge, Sn, V, Nb, Ta, P, As, Sb, Bi, Cr, Mo, W, Mn, Tc, Re, Ru, and Os.

3. The insulating film according to claim 1, wherein
the constituent element includes at least one of Sc, Y, B, Al, Ga, In, Tl, La, Ce, Pr, Nd, Pm, Sm, Eu, Gd, Tb, Dy, Ho, Er, Tm, Yb, and Lu; and
the additive element includes at least one of Ti, Zr, Hf, Ce, C, Si, Ge, Sn, V, Nb, Ta, P, As, Sb, Bi, Cr, Mo, W, Mn, Tc, Re, Ru, and Os.

4. The insulating film according to claim 1, wherein
the constituent element includes at least one of Si, Ce, Hf, Zr, Ti, Ge, and Sn; and
the additive element is V, Nb, Ta, P, As, Sb, Bi, Cr, Mo, W, Mn, Tc, Re, Ru, and Os.

5. The insulating film according to claim 1, wherein
the constituent element includes at least one of V, Nb, Ta, P, As, Sb, and Bi; and
the additive element includes at least one of Cr, Mo, W, Mn, Tc, Re, Ru, and Os.

6. The insulating film according to claim 1, wherein
the constituent element includes at least one of Cr, Mo, and W; and
the additive element includes at least one of Mn, Tc, Re, Ru, and Os.

7. The insulating film according to claim 1, wherein
the constituent element includes at least one of Mn, Tc, and Re; and
the additive element includes at least one of Ru and Os.

8. A semiconductor device comprising:
a semiconductor layer;
an insulating film according to claim 1 provided on the semiconductor layer;
a gate electrode provided on the insulating film; and
a source region and a drain region that are formed in a surface of the semiconductor layer, the source region and the drain region sandwiching a region below the gate electrode.

9. A semiconductor device comprising:
a first electrode;
an insulating film according to claim 1 provided on the first electrode; and
a second electrode provided on the insulating film.

10. A semiconductor device comprising:
a semiconductor layer;
a first insulating film provided on the semiconductor layer;
a first electrode provided on the first insulating film;
a second insulating film provided on the first electrode, at least one of the first insulating film and the second insulating film consisting essentially of an insulating film according to claim 1;
a second electrode provided on the second insulating film; and
a source region and a drain region that are formed in a surface of the semiconductor layer the source region and the drain region sandwiching a region below the first insulating film.

11. An insulating film comprising an oxide or an oxynitride of a constituent element having a positive valence, the oxide or the oxynitride containing an additive element having a larger valence than the constituent element in a range not less than $3 \times 10^{-8}$ at % and less than $1.6 \times 10^{-3}$ at %, wherein
the constituent element includes at least one of Sr, Ba, Ca, and Mg; and
the additive element includes at least one of B, Al, Ga, In, Tl, C, Si, Ge, Sn, P, As, Sb, Bi, Cr, Mo, W, Mn, Tc, Re, Ru, and Os.

12. An insulating film comprising an oxide or an oxynitride of a constituent element having a positive valence, the oxide or the oxynitride containing an additive element having a larger valence than the constituent element in a range not less than $3 \times 10^{-8}$ at % and less than $1.6 \times 10^{31\ 3}$ at %, wherein
the constituent element includes at least one of B, Al, Ga, In, and Tl; and
the additive element includes at least one of C, Si, Ge, Sn, P, As, Sb, Bi, Cr, Mo, W, Mn, Tc, Re, Ru, and Os.

* * * * *

UNITED STATES PATENT AND TRADEMARK OFFICE
CERTIFICATE OF CORRECTION

| | |
|---|---|
| PATENT NO. | : 7,518,199 B2 |
| APPLICATION NO. | : 11/318622 |
| DATED | : April 14, 2009 |
| INVENTOR(S) | : Shimizu et al. |

It is certified that error appears in the above-identified patent and that said Letters Patent is hereby corrected as shown below:

Claim 10, column 16, line 17, change "layer the" to --layer, the--.

Claim 12, column 16, line 34, change ""$1.6 \times 10^{31\ 3}$" to --$1.6 \times 10^{-3}$--.

Signed and Sealed this

Ninth Day of June, 2009

JOHN DOLL
*Acting Director of the United States Patent and Trademark Office*